United States Patent [19]

Beebe et al.

[11] 4,427,757
[45] Jan. 24, 1984

[54] TANNABLE IMAGING ELEMENT

[75] Inventors: George W. Beebe, Roseville, Minn.; Michael T. Macioch, Baldwin, Wis.

[73] Assignee: Minnesota Mining and Manufacturing Company, St. Paul, Minn.

[21] Appl. No.: 495,805

[22] Filed: May 18, 1983

[51] Int. Cl.³ .......................... G03C 1/06; G03F 7/02
[52] U.S. Cl. .................... 430/264; 430/306; 430/358; 430/363; 430/405; 430/539; 430/566; 430/961; 430/945
[58] Field of Search .............. 430/264, 566, 306, 539, 430/405, 961, 945, 363, 358

[56] References Cited

U.S. PATENT DOCUMENTS

| | | | |
|---|---|---|---|
| 3,276,871 | 10/1966 | Abbott | 430/264 |
| 3,300,307 | 1/1967 | Smith | 430/566 |
| 3,364,024 | 1/1968 | Yackel et al. | 96/29 |
| 3,639,126 | 2/1972 | Verelst | 430/264 |
| 4,076,531 | 2/1978 | Crowell | 430/264 |
| 4,093,458 | 6/1978 | McGrail et al. | 96/87 |
| 4,115,118 | 9/1978 | Kubotera et al. | 430/264 |
| 4,173,477 | 11/1979 | Shiba et al. | 430/264 |
| 4,233,392 | 11/1980 | Friedel | 430/264 |
| 4,369,245 | 1/1983 | Beruto et al. | 430/264 |

FOREIGN PATENT DOCUMENTS 1097608  1/1968  United Kingdom .

*Primary Examiner*—Mary F. Downey
*Attorney, Agent, or Firm*—Donald M. Sell; James A. Smith; Lorraine R. Sherman

[57] ABSTRACT

A tannable photographic element and method therefore, the element comprising a uniquely treated opaque, translucent, or transparent base support and having at least one pigment in reactive association with the silver halide emulsion layer is useful in the graphic arts. The base support comprises an extremely thin gelatin subbing layer substantially free of hardener, or no subbing at all, on a primed base support.

20 Claims, No Drawings

TANNABLE IMAGING ELEMENT

DESCRIPTION

1. Technical Field

This invention relates to an improved silver halide photographic element for use in a method of image formation by tanning development, the element comprising a uniquely treated opaque, translucent, or transparent base support. In another aspect, it relates to a method of obtaining negative images having a reflection optical density in the range of 1.0 to 2.0 for opaque and translucent base supports and a transmission optical density in the range of 1.0 to 3.5 for transparent base supports.

2. Background Art

It is known in the art that image formation methods using tanning development are based on the fact that in the presence of exposed silver halide, certain compounds, known as tanning developers, oxidize in an alkaline environment to give gelatin hardening compounds. The unexposed regions of the image, being unhardened, can be washed away with warm water. It is thus possible, with the known methods of the art, to obtain relief images of gelatin which have been used, for example, in matrix methods of the Technicolor ® type.

For the purpose of colored relief image formation, it has been proposed to use colored materials (especially carbon) dispersed in the non-sensitive layer of a two layer tannable construction such as that shown in U.S. Pat. No. 3,364,024. In this reference, all of the pigment is present in a layer adjacent to the silver halide emulsion layer and the element uses a conventional base support. U.S. Pat. No. 4,233,392 relates to a light-sensitive gelatin layer on a conventional base support containing silver halide and either in the same layer or an adjacent layer specially treated carbon black as a pigment, the silver being required to be present in an amount of at least 0.6 g/m$^2$, and preferably substantially higher. G.B. Patent Specification 1,097,608 relates to a two layer tannable system in which a light-sensitive silver halide emulsion is coated onto a conventional transparent film support and coated over the emulsion in a photographically inert layer containing one water-insoluble colored pigment.

It is disclosed in Assignee's copending patent application, U.S. Ser. No. 299,726, filed Sept. 8, 1981, now allowed, that a photographic element for tanning development having properties useful for the photographic industry and having a reduced amount of silver in the silver halide emulsion layer comprises a conventional base support, a layer of silver halide emulsion in non-hardened gelatin including a tanning developer dispersed therein, and over said emulsion layer, a layer of non-hardened gelatin comprising at least one colored pigment dispersed therein.

It is known in the art that an opaque, translucent, or transparent base support for a photographic element comprises a resin coated paper or film having a subbing layer with hardened gelatin therein. For example, RC paper type 700-30 (Schoeller Technical Papers, Inc., Pulaski, NY) comprises a corona primed polyethylene coated paper base and over this is a subbing layer containing hardened gelatin to protect the corona primed substrate and to provide adhesion for the photographic coating. A typical polyester transparent base has a subbing layer containing hardened gelatin, as disclosed in U.S. Pat. No. 4,093,458, Examples 1 and 3, which include formalin, a known gelatin hardener, in the subbing layer formulation.

DISCLOSURE OF THE INVENTION

Briefly, the present invention provides a negative-acting tannable silver halide photographic element that comprises a uniquely treated base support, wherein the support which is opaque, translucent, or transparent contains an extremely thin substantially unhardened (i.e., substantially free of hardener) hydrophilic colloid subbing layer selected from gelatin, polyvinylpyrolidone, polyvinyl alcohol, polyamides, and cellulose derivatives. Dispersions using hydrophobic polymers such as polyvinylidene chloride and polyethylacrylate are useful as well. Primed base with no subbing at all is useful also, instead of the conventional hardened gelatin subbing on the base, to provide superior image quality and low minimum density while maintaining excellent emulsion adhesion characteristics. As mentioned above, it is known in the art to use a hardened gelatin subbing layer between the base support and the gelatin silver halide layer. However, in tannable systems, subbing with hardener produces overall fog or background haze, leading to poor wash-off of the tanned image. The subbing layer of the present invention, which underlies the silver halide emulsion and which is substantially free of hardened gelatin, also contributes to greatly improved aging characteristics of the element. The unhardened gelatin subbing is an extremely thin layer, i.e., it has a coating weight of less than 0.3 g/m$^2$, preferably it is between 0.15 and 0.25 g/m$^2$, and adds no measurable thickness to the resulting gelatin resist. In view of the prior art practice of using a base support having a subbing layer of hardened gelatin thereon, it is surprising that a primed base support with or without a subbing layer of unhardened gelation results in excellent adhesion of the photosensitive layer to the support, superior image quality, low minimum density, and provides a photographic element with improved aging properties. As already mentioned, use of gelatin subbing, with gelatin being unhardened, is optional. Satisfactory and even excellent results are achieved by coating the silver emulsion directly on a base support that has been treated with ionizing radiation, as mentioned above.

It has been found that single or two layer constructions on opaque, translucent, or transparent base supports having at least one colored pigment which is preferably an organic pigment (i.e., not including carbon black), to provide a colored or black image with a reflection or transmission optical density of at least 1.0, dispersed in a properly sensitized silver halide emulsion using gelatin substantially free of hardener and with a tanning developer therein, can produce a low silver content photographic system with competitive speed and have enhanced image quality. By "substantially free of hardener" or "a substantially unhardened gelatin layer" is meant a layer which exhibits hardness no greater than a gelatin layer containing 1 g of formaldehyde per kg of freshly coated gelatin. Gelatin extenders or gelatin replacements, partial or complete, such as polyvinyl alcohol or polyvinylpyrolidone, in quantities known in the art can be used as well, either in the silver halide emulsion or in the subbing layer. By a "primed substrate" is meant a substrate that has been treated by ionizing radiation such as ultraviolet radiation, flame treatment, and preferably corona discharge treatment, and classical primer coatings which promote adherence of a coating layer to a substrate, such as polyvinylidene chloride.

The present invention provides a photographic element for tanning development which is a layered structure comprising an opaque, translucent, or transparent base support, the base support being primed and optionally comprising a layer of substantially unhardened gelatin subbing thereon, the subbing layer having a coating weight of less than 0.3 g/m², and spread over said support a layer of silver halide emulsion in gelatin substantially free of hardener containing a tanning developer and at least one colored pigment dispersed therein which absorbs radiation in the range of 350 to 700 nm, the silver of said silver halide emulsion being present in a quantity of less than 0.6 grams per square meter, and the gelatin of said emulsion layer being present in a quantity such as to provide a silver/gelatin weight ratio of less than 0.5, the emulsion layer gelatin/total tanning developer weight ratio being in the range of 5 to 25, and a protective topcoat layer containing between 0.02 and 0.30 g/m² of a non-diffusable hydroquinione and, optionally, part of said pigment(s) (i.e., up to 30 weight percent, preferably up to 20 weight percent, of the total pigment present) in the protective topcoat layer. After exposure to suitable radiation and upon development in a tanning activator comprising an alkaline solution having a pH of at least 9.5, the element is then subjected to a wash-off procedure for removing unexposed portions of the gelatin layer. When the pigment is present in sufficient quantity, a reflection optical density in the range of 1.0 to 2.0, preferably in the range of 1.1 to 1.6 for opaque and translucent base supports, and a transmission optical density in the range of 1.0 to 3.5 for transparent base supports is provided. For those applications where it is desirable to remove underlying grayness from residual or developed silver in the imaged areas, for example, in single layer colored images for proofing and other applications where color fidelity is important, a subsequent treatment with bleach/fix, as is known in the art, may be employed.

The present invention also describes a method for imaging a photographic element, which element is described above. A tanning development agent is included in the emulsion layer (it is introduced in known manner in aqueous solution, for example, in a 5 to 7 weight percent solution in the case of hydroquinone, Phenidone (1-phenyl-3-pyrazolidone), Metol (N-methyl-p-aminophenol sulfate), or mixtures thereof), and at least one colored pigment is present in reactive association with the silver halide layer. It has been found that the image quality obtained by exposure and development in a buffered alkaline bath as described above is improved if the silver content is less than 0.6 grams per square meter, preferably less than 0.5 and more preferably lies between 0.25 and 0.4, if at the same time the silver/emulsion layer gelatin weight ratio in the sensitive layer is less than 0.5, preferably less than 0.35, and more preferably between 0.15 and 0.35.

DETAILED DESCRIPTION

The present invention provides a photographic element comprising a primed opaque, translucent, or transparent base support substantially free of hardened gelatin and optionally comprising a thin layer of substantially unhardened gelatin subbing and a silver halide emulsion coated thereon. The silver halide emulsion has in reactive association therewith at least one pigment. Preferably all or a portion of the pigment is present in the silver halide layer, but a portion of the pigment may be present in an adjacent layer.

The base support upon which the emulsion is spread is free of hardened gelatin and preferably contains a layer of unhardened gelatin subbing having a coating weight less than 0.3 g/m² and may be flexible or rigid and may be opaque, translucent, or transparent. When the support is opaque or translucent, preferably the support is resin coated paper, e.g., RC paper type 700-30 (Schoeller Technical Papers, Inc.). The support can be prepared with an unhardened gelatin subbing layer.

Opaque, translucent, or transparent supports used in this invention include strippable papers such as RC Paper grade MIS, lot 6737 (Schoeller Technical Papers, Inc. Pulaski, N.Y.) and originally opaque supports such as papers and opaque films prepared by incorporating a pigment such as titanium oxide, etc., in transparent films, plastic films the surfaces of which have been treated by the method described in Japanese Pat. Publication No. 19068/72, and papers, and films made, for example, of plastic which has been rendered completely light shielding by addition thereto of carbon black or dye, etc. Typical examples of flexible supports are those ordinarily employed for photographic materials, such as cellulose nitrate films, cellulose acetate films, cellulose acetate butyrate films, cellulose acetate propionate films, polystyrene films, polyethylene terephthalate films, polycarbonate films, laminates of these films, thin glass sheets, baryta-coated papers, papers laminated with a polymer of an α-olefin having 2 to 10 carbon atoms such as an α-polyolefin polymer, in particular, polyethylene, polypropylene or an ethylene-butene copolymer, and plastic films having improved adhesion to other polymers and improved printability by roughening the surfaces thereof as described in the above-mentioned Japanese Pat. Publication. Examples of rigid base supports include thick translucent layers of polyvinyl chloride which may be rendered light shielding. For purposes of adhesion the base is primed. Opaque or translucent bases are treated with ionizing radiation (preferably corona treatment). With transparent bases, such as polyester bases, classical primer coatings as are known in the art, which preferably is a coating of polyvinylidene chloride, are used.

The present invention relates even more preferably to a photographic element as heretofore described, in which the silver halide emulsion includes silver chloride, bromide, bromochlorides, iodochlorobromides, chlorobromides, or iodobromides, or mixtures thereof. The emulsion is prepared by methods well known in the art and can be sensitized both chemically and spectrally in the manner described in G. F. Duffin, "Photographic Emulsion Chemistry", Focal Press, New York (1966) and P. Glafkides, "Photographic Chemistry", Fountain Press, London (1958). The present invention envisions varying the composition of the photosensitive emulsion so as to optimize the photo-speed for the application intended, as for example in phototypesetting paper or film.

Spectral sensitizers include not only conventional spectral sensitizers within the visible range, i.e. 300 to 700 nm, but also supersensitizers and longer wavelength sensitizers and combinations thereof which extend the range into the infrared region of the spectrum, e.g., from 300 up to 1000 nm, preferably up to 900 nm, and most preferably from 350 up to 850 nm. For example, the emulsion can be sensitized to blue-green radiation in the range of 470 to 560 nm, to red radiation in the range of 610 to 690 nm, or to infrared radiation in the range of 780 to 850 nm.

Any pigment useful in photography or photographic emulsions which is not diffusable in the gelatin layer even when saturated with an aqueous solution, and which in itself is not reactive with the photographic emulsion to give adverse effects such as fogging or desensitizing, can be used for the purpose of the present invention provided it is introduced by methods and with surface active agents which are compatible with the silver halide emulsion used (those surface active agents are known in the art as dispersing agents, and are useful whether they be anionic, non-ionic, cationic or amphoteric, such as those described in Schwarty et al., *Surface Active Agents and Detergents*, Vol. I and II, Interscience Publishers, and in U.S. Pat. Nos. 2,992,108, 3,068,191, 3,201,252, 3,165,409, in French Pat. Nos. 1,556,240 and 1,497,930, in British Pat. Nos. 580,504, 985,483 and 1,274,523, and in U.S. Pat. Nos. 3,762,025 and 3,860,425), and compatible with the method for obtaining a colored relief image according to the present invention.

Certain organic pigments with particle size less than 1.0 micron diameter, preferably less than 0.5 micron diameter, and having optical absorption in the range of 350 to 700 nm and which form aqueous dispersions are particularly useful, such as Flexonil ® Blue AN No. 15-1032, Colonyl Yellow FGL-A No. 11-3011, and Colonyl Red FGR No. 13-3054 (American Hoechst, Elk Grove Village, IL); Phthalo Blue WD 2345, Orange Scarlet WD 2665, Deep Orange Red WD 2673, and Phthalo Green WD 2744 (Daniel Products Co., Jersey City, NJ). These aqueous dispersions are prepared by suspending water-insoluble pigments in water as is known in the art. Photographic applications of the present invention may contain certain particular mixtures of pigments to produce suitable black or near-black images.

The present invention envisions embodiments wherein some of the pigment (i.e., up to 30 weight percent, preferably up to 20 weight percent, of the total pigment present) is coated in a separate layer over the silver halide emulsion containing the tanning developer, although preferably the pigment is dispersed in the light sensitive silver halide layer. Pigment in the light sensitive layer range in amount from 0.5 to 4.0 g/m$^2$, preferably 0.7 to 1.0 g/m$^2$ on opaque and translucent base supports and 0.5 to 3.0 g/m$^2$ on transparent base supports.

It may be advantageous to vary the ratio and kind of pigments to optimize the photographic element for its intended exposing radiation.

The choice of the tanning development agent has not been found to be as critical as described in the aforesaid U.S. Pat. No. 3,364,024, in the sense that even catechol was found useful for the purposes of the present invention. At least one hydroquinone, diffusible or non-diffusible, and preferably diffusible, was found to be preferable because of its wider range of activity combined with the greater stability of its oxidation product, as, for example, described in "Theory of Tanning Development" by W. H. Evans at the RPS Centenary Conference 1953, the summary of which is given in *Science et Industrie Photographique*, No. 5, 2nd Series, page 357, of September 1953, and also because of its lower cost.

For the purpose of the present invention, the presence of the tanning agent in the light sensitive layer has been found significant, in that it must be present in a sufficient quantity to ensure tanning of the pigmented layer, both in relation to the quantity of silver halide and in relation to the thickness (i.e., the gelatin quantity) of the sensitive layer which contains it. For those silver/gelatin values which are most useful for the purpose of the present invention, it has been found that emulsion layer gelatin/total tanning agent weight ratio values which are particularly useful are those which lie between 5 and 25, and preferably between 12 and 18, these values being calculated in particular for hydroquinone/Phenidone blends. "Tanning agent" as used herein means at least one compound selected from hydroquinone, Phenidone, and Metol, and preferably is a combination of hydroquinone and Phenidone having a weight ratio of hydroquinone to Phenidone of 16.5:1 to 1.2:1 and preferably it is 7.7:1. In studying the optimum tanning agent quantity, it has been found that excessive quantities lead to partial tanning even of the non-exposed zones. In the case of graphic arts applications, this leads to a smaller exposure range and a reduction in image quality.

A topcoat of substantially unhardened gelatin is useful to protect the silver halide emulsion from abrasion. It has been found that certain nondiffusible antioxidants, including nondiffusible hydroquinones improve the image quality and preferably are present in the topcoat layer in amounts in the range of 0.02 to 0.30 g/m$^2$ for substituted hydroquinones. Substituted hydroquinone can be optionally included in the silver halide emulsion layer. This non-diffusible hydroquinone is in addition to the hydroquinone/Phenidone agent incorporated in the silver halide emulsion layer.

In the present invention, the activator used is known in the art and comprises an aqueous solution of sodium or potassium carbonate and sodium or potassium sulfate. Typically, the activator solution contains 12 weight percent Na$_2$SO$_4$ and 2 weight percent Na$_2$CO$_3$ in water to make 1 liter, and sufficient NaHCO$_3$ is added to adjust the pH to 10.1.

Another feature of this tanning system is the fact that on a clear or transparent base, such as polyester, the exposing light may enter the light sensitive layer from either side of the base support unless, of course, an antihalation layer of high density is applied to the backside of the support.

Also, the present invention provides a method for obtaining a colored image in a photographic element comprising a primed support which optionally has a subbing layer substantially free of hardener thereon, and spread thereover a photographic emulsion layer containing silver halide in gelatin substantially free of hardener and comprising a tanning developer and, as described above, at least one colored pigment dispersed therein, said method consisting of exposing said element to radiation in the visible range of 350 to 700 nm, through the emulsion layer, or it may be exposed through the base, and causing it to be developed by the tanning developer included in the element by using an alkaline activating solution comprising, e.g., sodium sulfate and sodium carbonate in aqueous solution having a pH of at least 9.5 to provide an image, and drying the resulting imaged element.

Finally, the present invention also provides a multicolored proof material according to the above-described method, the method further comprising the steps of separately exposing with a visible argon ion blue laser at least 3 photographic elements on transparent base supports, each containing at least one pigment selected from yellow, cyan (blue), magenta (red), and mixtures of pigments to give a black-appearing image; contacting the exposed elements and developing separately with an activator solution having a pH of at least 9.5; employing a wash-off procedure and optionally a bleach-fix bath to remove unexposed portions and unwanted silver density on exposed portions of the coated gelatin-containing layers of each element to provide pure colored images; drying the resulting colored imaged elements; and overlaying the dried colored imaged elements to produce a multi-colored proof.

As is known in the art, one or more backing layers may be applied to the base support, e.g., an anti-curl layer, anti-static layer, and an antihalation layer.

Elements of the present invention find use particularly in phototypesetting paper and film applications, camera speed paper and film, contact speed paper and film including color proofing, strippable paper for backlit applications, and laser scanning or proofing exposure techniques.

This invention also finds application for exposure to longer wavelength radiation, such as that radiation emitted by a helium-neon laser diode, and laser diodes such as GaAlAs-GaAs, InGaAsP-InP, and DH laser diodes and radiation sources emitting at wavelengths from 300 to 1000 nm.

Objects and advantages of this invention are further illustrated by the following examples, but the particular materials and amounts thereof recited in these examples, as well as other conditions and details, should not be construed to unduly limit this invention.

EXAMPLE 1

A light-sensitive layer (A) and a protective layer (B) for a tannable, photographic element, applied on a corona primed resin coated paper base support (Schoeller paper type 700-30, without a subbing layer), was prepared as follows, with the base being designated Base 1:

A. A pigmented, light-sensitive, unhardened gelatin layer containing a silver iodobromide emulsion (92.6 mole percent silver bromide and 7.4 mole percent silver iodide) at a silver coverage of 0.35 gm/$^2$, emulsion layer gelatin/total tanning developer weight ratio of 17.8 (88.8 weight percent hydroquinone and 11.2 weight percent Phenidone) and a 30:30:40 ratio pigment blend of Flexonil Blue AN, Colanyl Red FGR, and Colonyl Yellow FGL-A in a quantity to obtain a black image utilizing pigment/emulsion layer gelatin weight ratio of 0.45 and silver/emulsion gelatin weight ratio of 0.18, was prepared. The total pigment was present at a level of 0.877 g/m$^2$.

B. An unhardened gelatin protective layer containing gelatin at a coverage of 0.48 g/m$^2$ and a non-diffusable hydroquinone (2,5-diisooctylhydroquinone) at a coverage of 0.15 g/m$^2$.

This material was then exposed on a conventional cathode ray tube Compugraphic ® Model 9600 typesetter (Compugraphic Corp., Wilmington, MA), (high intensity, short duration exposure) and upon development in a tanning activator for 32 sec. at 90° F. (32° C.) containing an alkaline solution having 12 weight percent sodium sulfate, 2 weight percent sodium carbonate, and sufficient sodium bicarbonate to adjust pH to 10.1 in one liter of solution, and followed by a wash-off procedure in 41° C. (105° F.) warm water for about 65 seconds to remove unexposed portions of the colored gelatin layer, produced an edgesharp image having a reflection optical density of 1.3 using a green light source of 540 nm. Results are shown in TABLE I.

A second photographic element was prepared using the procedure and formulations of EXAMPLE 1 except that the tannable element was applied to a corona primed, resin coated base support (RC paper type 700-30) having an unhardened gelatin subbing layer with a gelatin coating weight in the range of 0.2 to 0.3 g gelatin/m$^2$ between the base support and pigmented light-sensitive layer. This base was designated Base 2. Results are shown in TABLE I.

A third photographic element was prepared using the procedure and formulations of EXAMPLE 1 with Base 2 with the exception that the gelatin subbing in Base 2 contained about 2 weight percent/gram gelatin of chrome alum hardener (i.e., RC paper 700-30 with a hardened subbing layer). This base was designated Base 3. Results are shown in TABLE I.

TABLE I

| | Minimum density | Maximum density | Image quality | Sample identity |
|---|---|---|---|---|
| Base 1 | | | | |
| fresh | .02 | 1.36 | excellent | No subbing, |
| 5 day 50° C./45 percent RH | .08 | 1.21 | fair | corona prime only |
| Base 2 | | | | |
| fresh | .03 | 1.33 | very good | corona prime, |
| 5 day 50° C./45 percent RH | .03 | 1.32 | good | unhardened gel subbing |
| Base 3 | | | | |
| fresh | .13 | 1.38 | good | corona prime, |
| 5 day 50° C./45 percent RH | 1.38 | 1.38 | non-existent | hardened gel subbing |

The data of TABLE I show that photographic elements prepared with a corona primed paper base support with an unhardened gelatin subbing layer (Base 2) had very good storability and good image quality. Photographic elements prepared with Base 1 had excellent fresh image quality and fair stored image quality. The photographic element with hardened gelatin subbing (Base 3) was unsatisfactory for practical application.

The runs of this EXAMPLE were repeated except that a Xenon flash-type Compugraphic ® ACM Model 9000, typesetter was used as the exposure source and similar results were obtained.

Samples with Base 1 and Base 2 provided high quality images for copy using a reflection camera.

EXAMPLE 2

Photographic elements were prepared, exposed and developed using the method and formulations of EXAMPLE 1, with Base 2, except that in addition to the pigment blend in the light sensitive layer an additional amount of the 30:30:40 (Flexonil Blue AN:Colonyl Red FGR:Colonyl Yellow FGL-A) pigment blend was also added to the protective layer B. The results are shown in TABLE II.

TABLE II

| Sample | Weight percent additional pigment in topcoat | Topcoat layer B, weight ratio, pigment/topcoat gel | Maximum density |
| --- | --- | --- | --- |
| 7 | 0 | 0 | 1.35 |
| 8 | 3.5 | 0.149 | 1.37 |
| 9 | 7.0 | 0.298 | 1.45 |
| 10 | 10.5 | 0.446 | 1.46 |
| 11 | 14.1 | 0.595 | 1.47 |

The data of TABLE II show that the overall maximum density was increased by the addition of increased pigment loading in the B layer and yet, with the same exposure setting, produced original copy with good edge sharpness.

EXAMPLE 3

The same highly sensitive optically sensitized layer A used in EXAMPLE 1, with Base 2, was similarly prepared, exposed, and developed except that the gelatin was varied in the range of 2.30 to 1.27 g of gelatin/$m^2$. In all cases silver was present at a level of 0.35 g/$m^2$ and the pigment was present at a level of 0.877 g/$m^2$. Results are shown in TABLE III.

TABLE III

| Sample | Weight ratio, pigment/ emulsion gel | Gelatin, layer A | Minimum density | Maximum density | Image quality |
| --- | --- | --- | --- | --- | --- |
| 12 | 0.38 | 2.30 g/$m^2$ | 0.02 | 1.24 | good |
| 13 | 0.43 | 2.04 g/$m^2$ | 0.02 | 1.23 | best |
| 14 | 0.49 | 1.79 g/$m^2$ | 0.02 | 1.22 | good |
| 15 | 0.57 | 1.53 g/$m^2$ | 0.02 | 1.20 | poor |
| 16 | 0.69 | 1.27 g/$m^2$ | 0.02 | 1.19 | background fog |

The data of TABLE III show that descreasing the amount of gelatin in layer A gave a slight decrease in maximum density obtained. The best image quality (Sample 13) was achieved at a level of gelatin low enough for good tanning but not so low as to produce poor coating quality and background fog. In all samples, the complete layer was washed away in the unexposed areas and the minimum density was equal to the reflected density of the raw base.

EXAMPLE 4

Materials were prepared, exposed, and developed according to EXAMPLE 1, with Base 2, with the exception that the silver to emulsion gelatin weight ratio was varied in layer A by varying the silver content to study the sensitometric response. Gelatin in all samples was present in the amount of 2.04 g/$m^2$. All minimum densities were 0.02. The results are shown in TABLE IV.

TABLE IV

| Sample | Weight ratio Ag/emulsion gel | Silver, layer A | Maximum density | Image quality |
| --- | --- | --- | --- | --- |
| 17 | 0.07 | 0.15 g/$m^2$ | 1.17 | Poor tanning and low density |
| 18 | 0.12 | 0.25 g/$m^2$ | 1.21 | Somewhat weak image |
| 19 | 0.17 | 0.35 g/$m^2$ | 1.20 | Good image |
| 20 | 0.22 | 0.45 g/$m^2$ | 1.24 | Good image |
| 21 | 0.27 | 0.55 g/$m^2$ | 1.25 | Good image |

The data of TABLE IV show that as silver coating weight was reduced, the density decreased. This was a function of the tanning reaction and was also evident in that the image quality deteriorated at a silver level of 0.25 g/$m^2$ and lower and a silver/emulsion gelatin weight ratio of 0.12 and lower.

EXAMPLE 5

Photographic elements were prepared, exposed, and developed using the method of EXAMPLE 1, with Base 2, with the exception that the developer ratio in layer A was varied to study the sensitometric responses of the final copy. The results are shown in TABLE V.

TABLE V

| Sample | Hydroquinone/Phenidone ratio in layer A | Maximum density | Image quality |
| --- | --- | --- | --- |
| 22 | 16.5 | 1.19 | weak image |
| 23 | 7.7 | 1.24 | good image |
| 24 | 3.4 | 1.23 | good image |
| 25 | 1.2 | 1.20 | thin image |
| 26 | 0.5 | 1.12 | weak image and background fog |

The data of TABLE V show that the weight ratio of components in the developer affects density and image quality. The ratio of hydroquinone to Phenidone in sample 23 produced a photographic element with optimum density and image quality.

EXAMPLE 6

Photographic elements were prepared, exposed, and developed using the method of EXAMPLE 1, with Base 2, using a sensitized emulsion suitable for phototypesetting applications with the exception that an aqueous dispersion of carbon black was substituted for the pigments used in layer A. An aqueous dispersion of carbon black, AquaBlaks 100 (Borden Pigment Division, 630 Glendale-Milford Road, Cincinnati, Ohio 45215), was added to obtain a pigment/emulsion layer gelatin weight ratio of 0.287. No image was obtained using the cathode ray tube phototypesetter used in EXAMPLE 1 (the carbon black filtered out the light entering layer A). The light exposure was then increased up to 32 seconds on a 5 KW Berkey Ascor (cat. no. 1601-48) vacuum printer (Berkey Technical Co., Woodside, NY) in a contact mode before a marginally acceptable image was then obtained.

This Example illustrates that the photographic element produced when carbon black was incorporated as the pigment in layer A was not useful for high intensity, short duration phototypesetting applications or for camera work at the low silver content of the present invention.

EXAMPLE 7

A tannable, photographic element was prepared as in EXAMPLE 1, exposed as described below, and developed using the method of EXAMPLE 1, with Base 2, with the exception that the iodobromide emulsion of layer A was substituted with a silver chlorobromide type emulsion. The emulsion was prepared as is known in the art for camera speed and contained 64 mole percent chloride and 36 mole percent bromide.

Two samples of the photographic element were then exposed on (1) a conventional graphic arts camera utilizing a pulsed Xenon light source for 4.5 sec at f/32 and on (2) a conventional graphic arts contact frame utilizing a 100 watt tungsten point light source at 117 lumens output, 163 cm distance from the source, for 9 sec. Additionally, the same formulation was coated on a conventional graphic arts type clear polyester base support and similarly exposed using the two sources. All photographic elements gave edgesharp negatives of the original and provided high quality images for graphic arts applications. This example illustrates the advantages of this tanning system where the emulsions and supports may be varied to produce a variety of photographic elements at different sensitivities. The photographic element has different capabilities depending on the emulsion sensitivity and can be used for high speed typesetting paper and film and also for slower speed contact paper and film. This same light-sensitive layer may also be applied to rigid opaque materials and processed in the normal manner described in EXAMPLE 1.

EXAMPLE 8

Three light-sensitive tannable constructions were prepared, exposed, and developed as in EXAMPLE 1 with the exception that the coated layers were applied to strippable membrane bases that were corona primed and had unhardened gelatin subbing, i.e. Schoeller paper base MIS LOT 6737 and the pigment blend of EXAMPLE 1 was replaced by a 50/50 blend of Flexonil Blue AN and Colonyl Red FGR to give the same total pigment weight as in EXAMPLE 1. This system has the advantage that individual colors or combinations can be exposed and stripped off after emulsion processing to produce a film that can be mounted on various substrates such as a thick transparent substrate for backlit applications.

EXAMPLE 9

Two samples of a tannable, photographic element were prepared. One was applied on a PVDC (polyvinylidene chloride) primed polyester support (this support was designated Base 4) and the other was applied on a PVDC support having a hardened gelatin subbing layer (this support was designated Base 5). The photosensitive layer A was the same as that of EXAMPLE 7 and the topcoat layer B was the same as that of EXAMPLE 1. The exposure and development method were the same as in EXAMPLE 1. The imaged element had a transmission optical density of 1.13 using a green light source of 540 nm. The results are shown in TABLE VI.

TABLE VI

| Sample | Minimum density | Maximum density | Image quality |
|---|---|---|---|
| Base 4 | 0.04 | 1.13 | very good |
| Base 5 | 0.06 | 1.13 | very good |

The data of TABLE VI show that very good results can be obtained with both bases except that Base 5 with the hardened subbing had some background fog. This same fog also increases with natural age of the material to a level unsuitable for practical use.

EXAMPLE 10

Four samples of contact speed color proofing material were prepared and developed using the method of EXAMPLE 7, with Base 4 of EXAMPLE 9, except that in addition to the first sample which had the blend of pigments of EXAMPLE 1, the other samples had only yellow, only red, and only blue pigment, respectively to give the same total pigment weight as in EXAMPLE 1. The materials were contact exposed under a 100 watt tungsten point light source at 117 lumens output, 163 cm distance from the source, for 9 sec, with their respective contact negatives, i.e.: black, yellow, magenta and cyan elements were then overlaid in register and produced a four color separation proof of the original with exceptional similarity to the original copy. The blue image had a maximum transmission density of 1.6 using a no. 2 red filter; the yellow image had a maximum transmission density of 1.2 using a no. 4 blue filter; the red image had a maximum transmission density of 1.9 using a no. 93 green filter, as measured on a Macbeth ® TD-504 Transmission Densitometer (Macbeth, Div. of Kollmorgen Corp., Newburgh, NY). The same high quality results obtained on Base 4 were also achieved on a polyester support which consisted of corona prime treatment only. Edgesharp images were produced with the individual colors. These materials were passed through a bleach-fix or fix bath in the processing cycle to remove residual silver left in the coated layer and resulted in a clear and bright final image.

EXAMPLE 11

Four samples of laser scanner color proofing material were prepared and developed using the method of EXAMPLE 10, with the exception that the emulsion was replaced with a highly sensitive emulsion sensitized for high intensity short duration exposure containing halides with the weight ratio of 63.8 percent chloride, 36 percent bromide, and 0.2 percent iodide. The materials were exposed on a HELL DC 300 argon ion visible laser scanner (HCM Graphic Systems, Great Neck, NY) with a peak energy emission at about 488 nm and they were then developed. The resulting edgesharp images were overlaid producing a very good color proof very similar to the original.

In both EXAMPLES 10 and 11, these materials may have an antihalation layer on the backside and may also utilize a bleach-fix or fix step in the processing cycle.

EXAMPLE 12

Photographic elements were prepared and developed using the method of EXAMPLE 1, with Base 4 of EXAMPLE 9, except that the light sensitive emulsion was coated at a silver coverage of 0.3 g/m$^2$ and the pigment/emulsion layer gelatin weight ratio was increased to 1.4. The material was exposed on a Berkey-King Dual 1000, model 116-061, 500 watt quartz iodine lamp for 13 seconds at a distance of 163 cm from the contact frame, produced edgesharp images with a transmission density of 3.0.

EXAMPLE 13

A tannable, photographic element was prepared using the method of EXAMPLE 1, exposed as below, and developed using the method of EXAMPLE 1. Base 4 and Base 5 from EXAMPLE 9 were employed utilizing the emulsion from EXAMPLE 7 with the exception that a sulphur/gold emulsion digestion method known in the art for improving the reciprocity characteristics of very short exposure times was employed. In addition, the emulsion was spectrally sensitized with 3,3'-diethylthiotricarbocyanine iodide. This matched the sensitivity peak of the emulsion to that of the infrared laser diode at about 813 nm.

The coated material, handled under Series 7 (Kodak) safelight, was exposed to a Xenon flash at $10^{-5}$ sec. using an 810 nm narrow cut and 0.7 neutral density (N.D.) filter, 60 cm from light source to 0-3 wedge. The resulting D-logE curves showed that the material exhibited excellent speed and contrast. This material was also capable of being exposed on an infrared laser diode system and both samples were exposed on a 12 milliwatt diode at about 817 nm with an 0.38 N.D. filter in the radiation path. Excellent edgesharp images were produced.

Because of the uniqueness of the laser diode imaging system in comparison to other emission systems, low cost reproduction scans of the original copy were produced. This was highly beneficial for producing opaque imaged hard copy on paper and film as well as individual four color separations for color proofing use.

EXAMPLE 14

Photographic elements were prepared and developed using the method of EXAMPLE 1, with Base 4 and Base 5 from EXAMPLE 9, with the exception that the iodobromide emulsion of layer A was substituted by a silver chlorobromide emulsion containing 85 mole percent bromide and 15 mole percent chloride. The emulsion was prepared as known in the art and sensitized to a spectral sensitivity of 633 nm using a carbocyanine dye (S-939 from Riedel-de Haën, W. Germany). The material was exposed to helium neon laser diode radiation in the range of 1.4 to 2.0 milliwatts. The resulting electronically generated halftone patterns produced edgesharp images on paper and film suitable for opaque hard copy as well as for usage in individual four color separations for color proofing.

Various modifications and alterations of this invention will become apparent to those skilled in the art without departing from the scope and spirit of this invention, and it should be understood that this invention is not to be unduly limited to the illustrative embodiment set forth herein.

We claim:
1. A tannable photographic element which is a layered structure comprising in sequence
   a. an opaque, translucent, or transparent primed base support,
   b. optionally, a substantially unhardened gelatin or other hydrophilic colloid subbing layer coated over the primed surface of said base support at a coating weight of less than 0.3 g/m$^2$,
   c. a layer of silver halide emulsion in gelatin substantially free of hardener and containing at least one tanning developer and at least one colored pigment dispersed therein that absorbs radiation in the range of 350 to 700 nm, the silver in said layer of silver halide emulsion being present in a quantity of less than 0.6 g/m$^2$, and the gelatin of said emulsion layer being present in a quantity so as to provide a silver/gelatin weight ratio of less than 0.5, and an emulsion layer gelatin/total tanning developer weight ratio in the range of 5 to 25, and
   d. a protective topcoat layer of substantially unhardened gelatin and containing in the range of 0.02 to 0.3 g/m$^2$ of a non-diffusable hydroquinone compound, said element being developable in an aqueous tanning activator comprising an alkaline solution having a pH of at least 9.5, and followed by a wash-off procedure for removing unexposed portions of the gelatin layer, and said at least one pigment being present in said element in a sufficient quantity to provide reflection optical density in the range of 1.0 to 2.0 for an element with an opaque or translucent base support, and a transmission optical density in the range of 1.0 to 3.5 for an element with a transparent base support.

2. The photographic element according to claim 1 further comprising up to 30 weight percent of said at least one pigment dispersed in said protective topcoat layer.

3. The photographic element according to claim 1, wherein said at least one tanning developer is selected from hydroquinones, 1-phenyl-3-pyrazolidone, and N-methyl-p-aminophenol sulfate.

4. The photographic element acording to claim 1, wherein said colored pigment comprises at least two pigments to give a black appearing image.

5. The photographic element according to claim 1, wherein the silver content of said silver halide emulsion layer lies between 0.25 and 0.5 grams per square meter.

6. The photographic element according to claim 1, wherein the silver/emulsion layer gelatin weight ratio is less than 0.35.

7. The photographic element according to claim 1, wherein said support is resin coated paper.

8. The photographic element according to claim 1, wherein said support is flexible, rigid, or strippable.

9. The photographic element according to claim 1 which is a contact speed paper or film.

10. The photographic element according to claim 1 which is a camera speed paper or film.

11. The photographic element according to claim 1 which is a phototypesetting paper or film.

12. The photographic element according to claim 1 which is a laser scanner film.

13. The photographic element according to claim 1, wherein said element is a laser scanner proofing film on a transparent base.

14. The photographic element according to claim 4 wherein said pigments are a blend of red, blue, and yellow pigments to give a black image.

15. The photographic element according to claim 1 wherein said emulsion is sensitized in the spectral sensitivity range of 300 to 1000 nm.

16. The photographic element according to claim 1 wherein said emulsion is sensitized in the peak spectral sensitivity range of 470 to 560 nm.

17. The photographic element according to claim 1 wherein said emulsion is sensitized in the peak spectral sensitivity range of 610 to 690 nm.

18. The photographic element according to claim 1 wherein said emulsion is sensitized in the peak spectral sensitivity range of 780 to 850 nm.

19. A method for obtaining a colored image in the photographic element of claim 1, comprising the steps of:
  (a) exposing said element to radiation in the range of 350 to 850 nanometers,
  (b) contacting the exposed element with an aqueous activator solution having a pH of at least 9.5,
  (c) removing unexposed portions of the coated gelatin-containing layers to provide an image, and
  (d) drying the resulting imaged element.

20. A method for obtaining a colored image on a transparent base comprising the steps of:
  (a) separately exposing with a visible laser a least 3 photographic elements of claim 1, each element containing at least one pigment selected from yellow, cyan, and magenta pigments,
  (b) contacting said exposed elements separately with an activator solution having a pH of at least 9.5,
  (c) removing unexposed portions by a wash-off process and optionally bleaching the unwanted silver density from the exposed portions of the coated gelatin-containing layers of each element to provide pure colored images,
  (d) drying the resulting colored imaged elements, and
  (e) overlaying the dried colored imaged elements to produce a multi-colored proof.

* * * * *

UNITED STATES PATENT AND TRADEMARK OFFICE
CERTIFICATE OF CORRECTION

PATENT NO. : 4,427,757

DATED : January 24, 1984

INVENTOR(S) : George W. Beebe and Michael T. Macioch

It is certified that error appears in the above-identified patent and that said Letters Patent is hereby corrected as shown below:

On title page, after line [22], kindly insert

-- Related U.S. Application Data

[63] Continuation-in-part of Ser. No. 412,272, Aug. 27, 1982, abandoned. --

In col. 1, after line 2, kindly insert

-- This is a continuation-in-part of application Ser. No. 412,272, filed Aug. 27, 1982, and now abandoned. --

Signed and Sealed this

Twelfth Day of April, 1988

Attest:

DONALD J. QUIGG

Attesting Officer

Commissioner of Patents and Trademarks